United States Patent

Razavi

[11] Patent Number: 6,057,414
[45] Date of Patent: May 2, 2000

[54] PROCESS OF PLASMA TREATING POLYMER MATERIALS

[75] Inventor: Ali Razavi, Dallas, Pa.

[73] Assignee: Micron Coating, Inc., Forty Fort, Pa.

[21] Appl. No.: 09/256,369

[22] Filed: Feb. 24, 1999

[51] Int. Cl.[7] ....................................... C08F 6/00
[52] U.S. Cl. ............................................. 527/491; 528/480
[58] Field of Search ............................... 527/491; 528/480

[56] References Cited

U.S. PATENT DOCUMENTS

| | | | |
|---|---|---|---|
| 3,309,221 | 3/1967 | Smith | 528/176 |
| 4,247,577 | 1/1981 | Imada et al. | 427/40 |
| 4,267,202 | 5/1981 | Nakayama et al. | 427/40 |
| 4,312,693 | 1/1982 | Salensky et al. | 156/272 |
| 4,344,981 | 8/1982 | Imada et al. | 427/40 |
| 5,169,675 | 12/1992 | Bartoszek-Loza et al. | 427/520 |
| 5,234,723 | 8/1993 | Babacz | 427/491 |
| 5,521,351 | 5/1996 | Mahoney | 219/121.59 |

*Primary Examiner*—Terressa M. Boykin
*Attorney, Agent, or Firm*—Birch, Stewart, Kolasch & Birch, LLP

[57] ABSTRACT

The present invention is drawn to a method of modifying a polymer material to improve the bonding, wetting and printing properties of the polymer material, comprising exposing said polymer to an ignited plasma under a vacuum. The present invention is further drawn to such a method wherein the plasma comprises methane and a second gas selected from air, carbon dioxide, carbon monoxide, nitrogen, oxygen or a mixture thereof.

27 Claims, No Drawings

PROCESS OF PLASMA TREATING POLYMER MATERIALS

FIELD OF THE INVENTION

The present invention is drawn to methods of modifying polymer materials to improve the bonding, wetting and printing properties of the polymer materials, regardless of the surface energy state and chemical polarities of the polymer structures, comprising exposing said polymers to an ignited plasma under a vacuum.

BACKGROUND OF THE INVENTION

Polymeric material may be categorized as fluorinated and non-fluorinated. Low surface energy materials are typically made from fluoropolymers. Because of their chemical properties, low energy materials of fluoropolymers are not bondable, wettable or printable.

To make fluoropolymer materials bondable, wettable or printable they need to be chemically etched. Chemical etching processes such as "TETRATECH" from W.L. Gore Co. or "FLUOROTECH" from Porter Processing are typically commercially used to make fluoropolymer materials suitable for bonding, wetting or printing. Chemical etching processes, such as sodium etching, remove fluoride atoms from the surface of the fluoropolymer material. Theses processes result in a surface which is chemically changed, and which is susceptible to wetting and interacting with other materials so that the fluoropolymer material can be made adhesive; treated with an epoxy; laminated or otherwise suitable for additive processes.

However, currently employed processes used for making fluoropolymer materials wettable, bondable and printable have several drawbacks, including causing the fluoropolymer material to undergo a color change; having a limited shelf-life and having a chemical additive on the surface. These processes also cannot be used effectively on all fluoropolymer materials, particularly those made of colored and expanded porous fluoropolymers. In addition, on a more global perspective, the currently used processes are hazardous to work with and create environmentally hazardous by-products.

When other polymeric materials, such as "KAPTON" (DuPont) Polyester and polyolefins, are used for printing or bonding, they are typically first treated with an organic base coat primer in order to provide better adhesion or printability. Examples of such base coat primers include organometallic film forming compounds such as silanes and siloxanes. However these processes are very costly and further result in xylene and hexane emissions. These processes also require excessive curing temperatures for primer coating, which causes delimination.

SUMMARY OF THE INVENTION

The present invention is drawn to a method of modifying a polymer material to improve the bonding, wetting and printing properties of the polymer material, comprising exposing said polymer to an ignited plasma under a vacuum.

The present invention is further drawn to such a method wherein the plasma comprises methane and a second gas selected from air, carbon dioxide, carbon monoxide, nitrogen, oxygen or a mixture thereof.

The present invention is particularly useful for improving said properties of fluorinated polymers.

DETAILED DESCRIPTION

The present invention is drawn to a method of making polymer materials bondable, wettable, and/or printable, by plasma treating polymeric materials, regardless of the surface energy state and chemical polarities of the polymer structures. The present process can be used on any polymer product including, films, powders, and any three-dimensional article, including porous and filter media membranes.

The process of the present invention produces a polymeric surface, which is wettable, bondable and/or printable for an indefinite period. By indefinite is meant that the surface will retain the properties and virtually does not age with time. That is, a surface produced with the present invention will have a bondable surface of indefinite shelf-life in all practical applications. In addition, with the present process the color of the polymer product is not changed as a result of the process and there is no chemical additive incorporated on the polymer. The present process is further environmentally and work-place friendly and does not produce any hazardous chemical by-products.

The present process may be used on both fluorinated and non-fluorinated polymeric materials. Of particular interest are fluoropolymers, such as fluorinated ethylene-propylene (available under from DuPont under the tradename FEP), perfluoroalkoxy-tetrafluoroethylene copolymer (PFA), polyvinyl fluoride (TELDAR), polyvinyl fluoride (KYNAR), polytetrafluoroethylene (TEFLON), polychlorotrifluoroethylene (HALAR), and polyimides (KAPTON); polyolefins, such as low and high density polyethylene and polypropylene; acrylic polymers and copolymers, such as polyacrylate, polymethylmethaacrylate and polyethylacrylate; vinyl halide polymers and copolymers, such as polyvinyl chloride, polyvinyl methyl ether, polyvinylidene fluoride, polyvinylidene chloride, polyacrylonitrile, polyvinyl ketones, polyvinyl amines and polystyrene; polyvinyl acetate; ethylene-methyl methacrylate copolymers; acrylonitrile-styrene copolymers; ABS resins; ethylene-vinyl acetate copolymers; natural and synthetic rubbers; butadiene-styrene copolymers; polyisoprene; synthetic polyisoprene; polybutadiene; butadiene-acrylonitrile copolymers; polychloroprene rubbers; polyisobutylene rubber; ethylene-propylene rubber; ehtylene-propylene-diene rubbers; isobutylene-isoprene copolymers; polyurethane rubbers; polyamides, such as NYLON 66 and polycaprolactam; polyesters, such as polyethylene terephthalate, polycarbonates, polyimides and polyethers.

The plasma treated polymers may be subsequently bonded to an adhesive or coating. Adhesives of interest to be bonded to the polymers plasma treated in accordance with the present method will be evident to one skilled in the art, and include, but are not limited to, silicone-based, acrylic-based and rubber-based, etc. adhesives. The plasma treated polymers may alternatively be bonded with a coating in the form of epoxies-based, silicone rubber-based, silicone-based, organic primers, organometallic-based, silane-based, siloxane-based and organotitanate-based, etc. coatings.

The present invention plasma-treats the surface of polymeric materials to make the surface of the polymeric materials wettable, bondable and/or printable. The method of the present invention is particularly useful in making pressure sensitive tapes. Currently, the only commercially available pressure sensitive PTFE tape for high temperature application is FURON TEMP-R-TAPE, made with a silicone adhesive. The FURON tape is notably not transparent. The present method allows the production of a PTFE pressure sensitive tape with improved properties over the FURON, including the property of being transparent.

The present method may also be used in the production of pressure sensitive tapes for medical applications. Pressure sensitive tapes for medical uses typically are produced by chemical etching of the fluoropolymeric films. However, the chemical etching process results in sodium leaching of the pressure sensitive tape. The present method overcomes the problem of sodium leaching and further produces a transparent tape, which is desirable for wound application.

An additional application of the present method is for the production of TEFLON/silicone SEPTA for cap liners. Cap liners, and other TEFLON-based products, made with the present method have the advantages of no discoloration of the TEFLON and no concern for sodium leaching, which results with chemical etching of the polymer.

Surface treating fluoropolymer tubing with the present plasma treating method provides a non-leaching surface which has at least 25% stronger bonding ability, compared to fluoropolymer tubing prepared using a chemical etching process. The fluoropolymer tubing produced with the present method will provide an improved catheter for medical uses.

Also in the medical industry, woven polyester materials are used for making vascular grafts. To make the vascular grafts radio-opaque, a ring of platinum or gold is typically attached to the graft prior to implantation in the patient. The present technique can be used to treat the polyester graft material to make the graft material susceptible to coating with platinum or gold through sputtering or evaporation deposition techniques. Plasma treating the polyester graft material in accordance with the present method, produces excellent adhesiveness between the platinum/gold and the graft material. Similarly, graft materials plasma treated may be subsequently metallized with a silver coating using sputtering or evaporation techniques, to provide antibacterial properties to the graft. The present method of preparing/treating polymer surfaces is particularly advantageous to the medical industry because it eliminates the need to use chemical processing and electroplating to metal coat polymer materials for radio-opacity and antibacterial properties.

The present plasma treating method may also be used to treat ultra high molecular weight polyethylene (UHMW) films, to produce a surface which is bondable to rubber-based materials. The present method when applied to UHMW can be used to bond the UHMW to rubber materials for bumper production in the marine industry.

The present invention may further be used for methods of preparing aqueous wettable filter media made from PTFE porous films, which are suitable for medical/biological filtering applications requiring filtering materials for aqueous media.

In terms of powdered polymers, the present method may be used in providing powders having a high surface energy suitable for numerous applications. For example, the surface treated polymer powders can be dispersed and mixed very effectively with other polymer resin materials for composite manufacturing of different shapes for bearings and other applications. The method also can be used to produce PTFE powders for ink applications having improved wetting and dispersibility.

In addition, the present method may be used with unscintered and expanded PTFE films to permit casting of other high dielectric materials like silicone rubber on the surface. This composite material provides new materials suitable for the cable industry and similar applications where arch protection is desired.

The process of the present invention is also useful for preparing polymers which can be used as a substrate upon which a metal; conductor; resistor or ceramic thin film can be deposited. Specific uses of this category include the attachment of copper foils to fluoropolymeric materials and their composite structures, for use in printed circuit board manufacturing. With conventional techniques, fluoropolymeric materials are made and copper foils are subsequently attached. With the present process the fluoropolymer is first treated with the plasma and the copper then deposited under the vacuum using either sputtering or evaporation. The sequential vacuum plasma treatment of the fluoropolymer followed by the vacuum deposition of the conductor/resistor copper material provides a manufacturing method for direct circuit board processing in a single manufacturing set up, along with a reduction in costs and elimination of hazardous chemical reactions.

It is also possible to use the present method of treating fluoropolymers to prepare fluoropolymer circuit board substrates made by screen printing. Because of the low surface energy of circuit boards, paste materials typically cannot be screen printed onto fluoropolymer substrates. However, plasma treating the fluoropolymer materials with the present methods renders the fluoropolymer materials bondable to circuit board pastes and permits screen printing of the circuit boards.

The process of the present invention comprises first placing the polymeric material in a vacuum chamber. The pressure of the vacuum chamber is then pumped to a pressure of approximately, $10^{-3}$ to $10^{-5}$, preferably approximately $10^{-4}$ Torr.

The vacuum chamber contains two conducting electrodes which are placed opposite each other in the chamber within 3 inches, preferably within 2 inches, more preferably within 1 inch of each other. One electrode is connected to an RF power supply and the other electrode is connected to a ground. Alternatively, a DC ion source may be used for ignition of the plasma. The polymeric material is in contact with the ground electrode.

The vacuum chamber is further connected to a high source each of methane and a second gas selected from the group consisting of nitrogen, oxygen, carbon monoxide, carbon dioxide, air, or a mixture thereof. The methane source should be of highly purified methane gas, which contains less than one part per million of nitrogen and oxygen and of a mixture of carbon dioxide and carbon monoxide. For example, ultra pure grade methane which typically contains approximately 100 ppm impurities in the form of 30 ppm nitrogen, 2 ppm oxygen, 10 ppm carbon dioxide/monoxide and 10 ppm water vapor, is suitable as a methane source for the present invention. The connections to the methane and second gas are typically through two mass flow meters. Alternatively, the methane and second gas mix may be contained in a single source tank and connected to the vacuum chamber with a single flow meter. After the base chamber pressure of $10^{-3}$ to $10^{-5}$ Torr is reached the methane and second gas are admitted into the chamber in a ratio of methane to second gas where the amount of second gas is present at ½ to ¹⁄₁₀₀ of the Sccm value of the methane.

The pressure the tank is then regulated to 100 $\mu$m (100 milltorr) by trottling the pressure, i.e. adjusting the pressure by controlling the valve opening, and the plasma ignited. The plasma may be ignited by the RF power supply producing a 110 KHz to a MHz frequency. Alternatively, a DC ion source may be used to ignite the plasma. The input power is 100–200 Watts, preferably 150 Watts, of forward power and the polymeric surface is exposed to the plasma for 20–45 seconds, preferably exposure is for approximately 30 seconds.

EMBODIMENTS OF THE INVENTION

EXAMPLE 1

Polytetrafluoroethylene (PTFE) films with 4 mil thick and red color and 2 mil skived and white color materials, having dimensions of 12" long and 4" wide, were placed on the ground electrode of a vacuum system having and RF and a ground electrode within 1" of each other and having a pressure of $10^{-4}$ Torr.

A mixture of methane and air was introduced into the vacuum chamber under the following conditions. The methane to air ratio was 6 Sccm:3 Sccm; pressure 100 $\mu$m and power 150 Watts/13.56 MHz. The plasma was ignited and the films were treated for 30 seconds with the plasma.

Table 1 shows the results of the plasma treatment of the polymers.

TABLE 1

| | contact angle* | XPS** | | | |
|---|---|---|---|---|---|
| | | F | O | C | N |
| before treatment | θ = 95–110 | 67.4 | — | 32.6 | — |
| after treatment | θ = 10–20 | 20.3 | 8.4 | 68.6 | 2.2 |

*Contact Angle measurement was done with tantec contact angle meter before and after treatment
**X-ray photo electron microscopy (XPS) for surface analysis The results of Table 1 are indicative of fluorine etching to low content and at the same time an increase the oxygen and nitrogen content of the surface of the film.

The treated sample was coated with 1.5 mil of a silicon, acrylic, rubber-based adhesive without applying any primer coating. The coated films of the present invention were then compared to commercially available tapes. The commercial tapes used in the present experiments were NORTON PTFE tape and DEWAL PTFE tape. Polyester tapes prepared by the present method were compared to DEWAL tapes, produced by Dow Chemical and Kapton tapes prepared by the present method were compared to PERMACEL tapes, 3M Corporation.

TABLE 2

| Condition | Plasma-treated | Commercial tape |
|---|---|---|
| Primed | No | Yes |
| Adhesion to steel* | 40.0 oz/in | 23.0 oz/in |
| Holding power test** | Passed | Fair |

*The adhesion to steel is a direct measurement of the adhesive strength of pressure sensitive tape. This test was done at room temperature by placing an approximately 1" wide tape on a steel plate. The measurement was done by placing one end of the tape, which was folded 180, in the jaws of a Tensile Testing machine. The adhesive strength was recorded as the pulling force exerted upon pulling the tape.
**The ASTM holding power test is a measure of the stability of the adhesive and substrate surface treatment used in the production of the pressure sensitive tape. For this test an approximately 1" strip of coated substrate material was placed on a steel plate with a weighted down clip and then baked at 500° F. for one hour, after which the strip was check for slippage. ASTM allows for 1/8" of slippage. Slippage of 1/8" is considered fair and less than 1/8" slippage is considered passing.

As an additional test, treated PTFE, fluorinated ethylene propylene (FEP) and perfluoroalkoxy-tetrafluorethylene (PFA) were marked using a Carter's "MARKS-A-LOT" permanent bullet point marker. The treated film retained the ink when rubbed by hand, but untreated film did not.

EXAMPLE 2

Polyamide (Kapton) films with dimensions of 5 mil thick, 12" long and 4" wide were plasma treated as detailed above in Example 1. Silicon adhesive base was applied at 1.5 mil to the films and adhesion and holding measured as before.

TABLE 3

| Condition | Plasma-treated | Commercial tape |
|---|---|---|
| Primed | No | Yes |
| Adhesion to steel* | 30.0 oz/in | 22.0 oz/in |
| Holding power test** | Passed | Fair |

EXAMPLE 3

Polyester films were plasma treated, as above, and subsequently 1.5 mil silicon rubber applied to the films. Adhesion and holding were measured as before.

TABLE 4

| Condition | Plasma-treated | Commercial tape |
|---|---|---|
| Primed | No | Yes |
| Adhesion to steel* | 46.0 oz/in | 32.0 oz/in |
| Holding power test** | Passed | Fair |

EXAMPLE 4

The present method of treating the surface of polymer materials is also useful in preparing polymers to act as substrates upon which metals, conductors, resistors or ceramic thin films may be deposited. Following plasma treatment in the vacuum, the treated polymer material may have a metal deposited on it using conventional vacuum sputtering and evaporation techniques. Typically, using conventional deposition techniques, the polymer will be subject to a vacuum of approximately $1 \times 10^{-6}$ Torr, and 1000 Å to 5 $\mu$m of conductor or resistor material deposited using sputtering or evaporation deposition.

When fluorpolymers are metallized without first being plasma treated with the present method, the adhesion (peel strength) to the substrate is less than 1 gr/mm. With a plasma treated fluoropolymer, the adhesion to the substrate increases approximately 50-fold.

In the present experiment, virgin PTFE and ROGERS Ro 3000 copper clad composite PTFE substrate materials were used. The copper clad materials were removed from the ROGER material resulting the in the ROGER substrate material.

Both the ROGER substrate and the virgin PTFE were placed in a vacuum and the pressure reduced to $1 \times 10^{-6}$ Torr. Both materials were exposed to a mixture of air and methane for plasma treatment. After 30 seconds of exposure to the plasma, the power was cut off and the air/methane turned-off.

Argon was then flowed into the vacuum chamber, which was also equipped with a 6" Varian sputtering cathode, with a copper target. After increasing the pressure to 4 miliTorr, the prepared ROGER substrate and virgin PTFE were rotated in front of the sputtering cathode and were sputtered with copper. More than 5 $\mu$m of copper were deposited on the substrate materials for the peel tests.

The peel test was performed by bonding epoxy to the metal and pulling in an Instrum machine. The peel strengths of the treated materials were compared to the peel strengths of untreated virgin PTFE and RO 3000 (PTFE composite). The peel strengths of the untreated materials was 1 g/mm, whereas after 30 seconds of plasma treatment, the peel strengths increased more then 50-fold.

We claim:

1. A method of modifying a polymer material comprising exposing said polymer to an ignited plasma comprising methane under a vacuum.

2. The method of claim 1, wherein said plasma comprises methane and a second gas selected from the group consisting of air, nitrogen, oxygen, carbon monoxide, carbon dioxide and a mixture thereof.

3. The method of claim 2, wherein said methane and second gas are present at amounts of methane to second gas of 6Sccm:3Sccm.

4. The method of claim 2, wherein said second gas is present at an amount of ½ to $\frac{1}{100}^{th}$ of the Sccm value of the methane.

5. The method of claim 1, wherein said vacuum has a pressure of $10^{-3}$ to $10^{-5}$ Torr.

6. The method of claim 5, wherein said vacuum has a pressure of $10^{-4}$ Torr.

7. The method of claim 1, wherein said polymer material comprises a fluorinated polymer.

8. The method of claim 1, wherein said polymer is selected from the group consisting of fluoropolymers; polyimides; polyolefins; acrylic polymers and copolymers; vinyl halide polymers and copolymers; polyvinyl acetate; ethylene-methyl methaacrylate copolymers; acrylonitrile-styrene copolymers; ABS resins; ethylene-vinyl acetate copolymers; natural and synthetic rubbers; butadiene-styrene copolymers; polyisoprene; synthetic polyisoprene; polybutadiene; butadiene-acrylonitrile copolymers; polychloroprene rubbers; polyisobutylene rubber; ethylene-propylene rubber; ehtylene-propylene-diene rubbers; isobutylene-isoprene copolymers; polyurethane rubbers; polyamides; polyesters; polycarbonates; polyimides and polyethers.

9. The method of claim 8, wherein said fluoropolymer is selected from the group consisting of fluorinated ethylene-propylene, perfluoroalkoxy-tetrafluoroethylene copolymer, polyvinyl fluoride, polyvinyl fluoride, polytetrafluoroethylene and polychlorotrifluoroethylene.

10. The method of claim 1, wherein exposure to the plasma is for 20–45 seconds.

11. The method of claim 10, wherein exposure to the plasma is for 30 seconds.

12. The method of claim 1, wherein the plasma is ignited with an RF power supply producing a 110 KHz to a MHz frequency.

13. The method of claim 1, wherein an input power to ignite the plasma is 100–200 Watts of forward power.

14. The method of claim 13, wherein the input power to ignite the plasma is 150 Watts of forward power.

15. The method of claim 1, wherein the vacuum has a pressure for exposure of 100 $\mu$m.

16. The method of claim 1, wherein said polymer is in the form of a powder, a film, or a three-dimensional object.

17. The method of claim 1, wherein said polymer is a filter media.

18. The method of claim 1, further comprising bonding said polymer to an adhesive or coating.

19. The method of claim 18, wherein said adhesive is a silicone-based, acrylic based or rubber-based adhesive.

20. The method of claim 18, wherein said coating is an epoxy-based coating, a silicone rubber-based coating, silicon-based coating, an organic primer, an organometallic-based coating, a silane-based coating, a siloxane-based coating or an organotitanate-based coating.

21. A method of making a pressure sensitive tape comprising modifying a polymer tape material using the method of claim 1 and coating said polymer tape material with an adhesive.

22. The method of claim 1, further comprising coating said polymer with a metal using sputtering or evaporation under a vacuum.

23. The method of claim 22, wherein said metal is platinum, silver, gold or copper.

24. A method of metallizing a medical polymer graft material comprising modifying a polymer graft material using the method of claim 1 and coating said modified polymer graft material with a metal using sputtering or evaporation under a vacuum.

25. A method of making a polymer circuit material comprising modifying a polymer circuit substrate material using the method of claim 1 and depositing on said modified polymer circuit substrate material a circuit material selected from the group consisting of a metal, a conductor, a resistor and a ceramic thin film.

26. The method of claim 25, wherein said circuit material is deposited by sputtering or evaporation under a vacuum.

27. The method of claim 25, wherein said circuit material is deposited by screen printing.

* * * * *